United States Patent
Iwashima

(10) Patent No.: US 6,977,483 B2
(45) Date of Patent: Dec. 20, 2005

(54) BATTERY PACK MALFUNCTION DETECTION APPARATUS AND METHOD FOR DETECTING A DISCONNECTION AT A CONNECTING LINE BETWEEN A GIVEN CELL AND A CORRESPONDING DETECTION TERMINAL

(75) Inventor: Makoto Iwashima, Yokosuka (JP)

(73) Assignee: Nissan Motor Co., Ltd., Kanagawa (JP)

( * ) Notice: Subject to any disclaimer, the term of this patent is extended or adjusted under 35 U.S.C. 154(b) by 208 days.

(21) Appl. No.: 10/643,997

(22) Filed: Aug. 20, 2003

(65) Prior Publication Data

US 2004/0036446 A1    Feb. 26, 2004

(30) Foreign Application Priority Data

Aug. 23, 2002    (JP)    ............... 2002-243178

(51) Int. Cl.[7] .............................. H01M 10/46
(52) U.S. Cl. .................................... 320/122
(58) Field of Search ................. 320/116, 118, 120, 320/122, 134, 136

(56) References Cited

U.S. PATENT DOCUMENTS

| | | | | |
|---|---|---|---|---|
| 3,686,530 A | * | 8/1972 | Bogut | ................ 320/112 |
| 4,713,597 A | * | 12/1987 | Altmejd | ............... 320/122 |
| 5,998,967 A | * | 12/1999 | Umeki et al. | ............ 320/122 |
| 6,014,013 A | * | 1/2000 | Suppanz et al. | ........... 320/122 |
| 6,373,225 B1 | * | 4/2002 | Haraguchi et al. | ......... 320/122 |
| 6,388,424 B1 | * | 5/2002 | Hidaka et al. | ............. 320/122 |
| 6,417,646 B1 | * | 7/2002 | Huykman et al. | .......... 320/122 |

FOREIGN PATENT DOCUMENTS

| JP | 2001-157367 A | 6/2001 |
|---|---|---|
| JP | 2001-1573678 A | 6/2001 |
| JP | 2001-286065 | 10/2001 |
| JP | 2002-168928 A | 6/2002 |
| JP | 2002-204537 A | 7/2002 |

* cited by examiner

*Primary Examiner*—Edward H. Tso
(74) *Attorney, Agent, or Firm*—McDermott Will & Emery LLP

(57) ABSTRACT

At either of the two terminals of each of a plurality of cells constituting a battery pack, a detection terminal is provided, and malfunction detection circuits each provided in correspondence to one of the cells each detect a malfunction of the corresponding cell based upon the voltage between the detection terminals. When shorting circuits are engaged in operation to short detection terminals corresponding to alternate cells from each other, a disconnection having occurred between a given cell and a corresponding detection terminal is detected based upon signals output from the malfunction detection circuits.

9 Claims, 6 Drawing Sheets

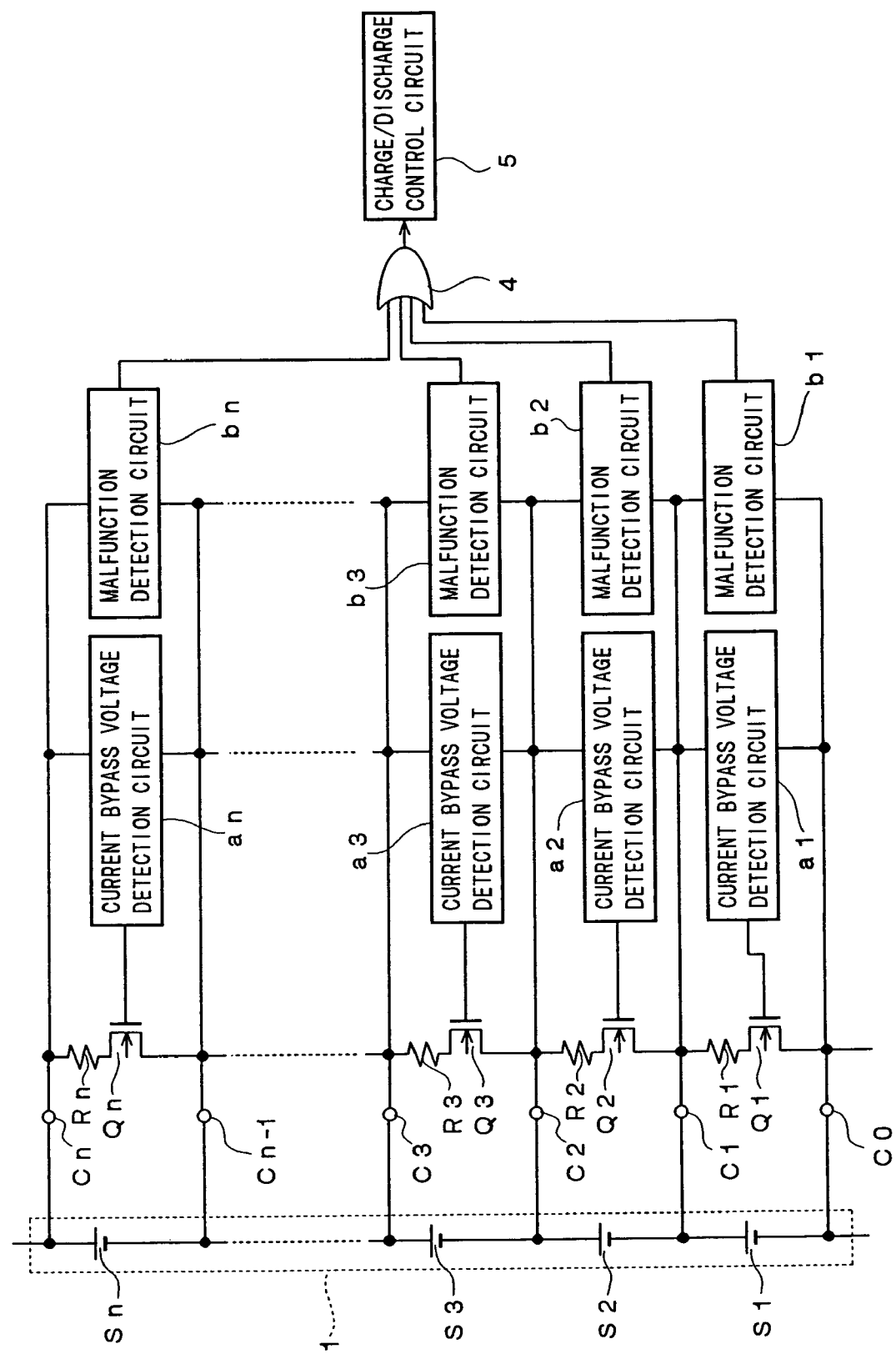
F I G. 5

BATTERY PACK MALFUNCTION DETECTION APPARATUS AND METHOD FOR DETECTING A DISCONNECTION AT A CONNECTING LINE BETWEEN A GIVEN CELL AND A CORRESPONDING DETECTION TERMINAL

BACKGROUND OF THE INVENTION

1. Field of the Invention

The present invention relates to a malfunction detection apparatus and method utilized to detect a malfunction of a battery pack constituted by connecting in series a plurality of cells and, more specifically, it relates to an apparatus and method for detecting a disconnection occurring at the line between a given cell and a detection terminal connected to either of the two terminals of the cell.

2. Description of the Related Art

There is a method in the known art adopted in an apparatus that includes detection terminals each connected to either of the two terminals of a given cell constituting a battery pack and detects an overcharge or an over-discharge occurring at the cell based upon the voltage between the two detection terminals connected to the cell (see Japanese Laid Open Patent Publication No. 2001-157367). In this method for detecting a defective connection, discharge circuits connected to the individual cells are first shorted over a predetermined length of time and then are opened, and if the voltage in the opened state is substantially equal to the voltage in the shorted state at any cell, it is determined that the connection between the cell and the corresponding detection terminal is defective.

SUMMARY OF THE INVENTION

However, if the voltage in the shorted state and the voltage in the opened state are compared with each other by utilizing a voltage comparator circuit employed in an over-discharge detection circuit in the related art, an overcharged state at the cell cannot be distinguished from a defective connection. This gives rise to a problem of having to provide two voltage comparator circuits, one for defective connection detection and the other for over-discharge detection in order to distinguish the one state from the other.

It would be desirable to provide a battery pack malfunction detection apparatus and a battery pack malfunction detection method that enable detection of a disconnection by utilizing a circuit which detects a cell malfunction.

A battery pack malfunction detection apparatus according to the present invention for detecting a malfunction in a battery pack constituted by connecting in series a plurality of cells comprises detection terminals each connected to either of two terminals of one of the plurality of cells, malfunction detection circuits each provided in correspondence to one of the plurality of cells to detect a malfunction of a corresponding cell based upon a voltage between the detection terminals, a plurality of shorting circuits that short every other pair of detection terminals from each other, a control circuit that engages the shorting circuits in operation and a disconnection detection circuit that detects a disconnection at a connecting line between a given cell and a corresponding detection terminal based upon signals output from the malfunction detection circuits when the control circuit engages the shorting circuits in operation.

In a method of detecting a malfunction of a battery pack constituted by connecting in series a plurality of cells according to the present invention, detection terminals at alternate cells among detection terminals each provided in correspondence to either of two terminals of one of the plurality of cells are shorted from each other and a disconnection of a connecting line between a cell and a corresponding detection terminal is detected based upon signals output from malfunction detection circuits each provided to detect a malfunction of the corresponding cell based upon a voltage between the detection terminals when the detection terminals at alternate cells are shorted from each other.

BRIEF DESCRIPTION OF THE DRAWINGS

FIG. 5 shows the structure of a battery pack malfunction detection apparatus to be compared with the battery pack malfunction detection apparatus achieved in the first embodiment in the explanation of advantages thereof.

DETAILED DESCRIPTION OF THE PREFERRED EMBODIMENTS

First Embodiment

Figure 1:
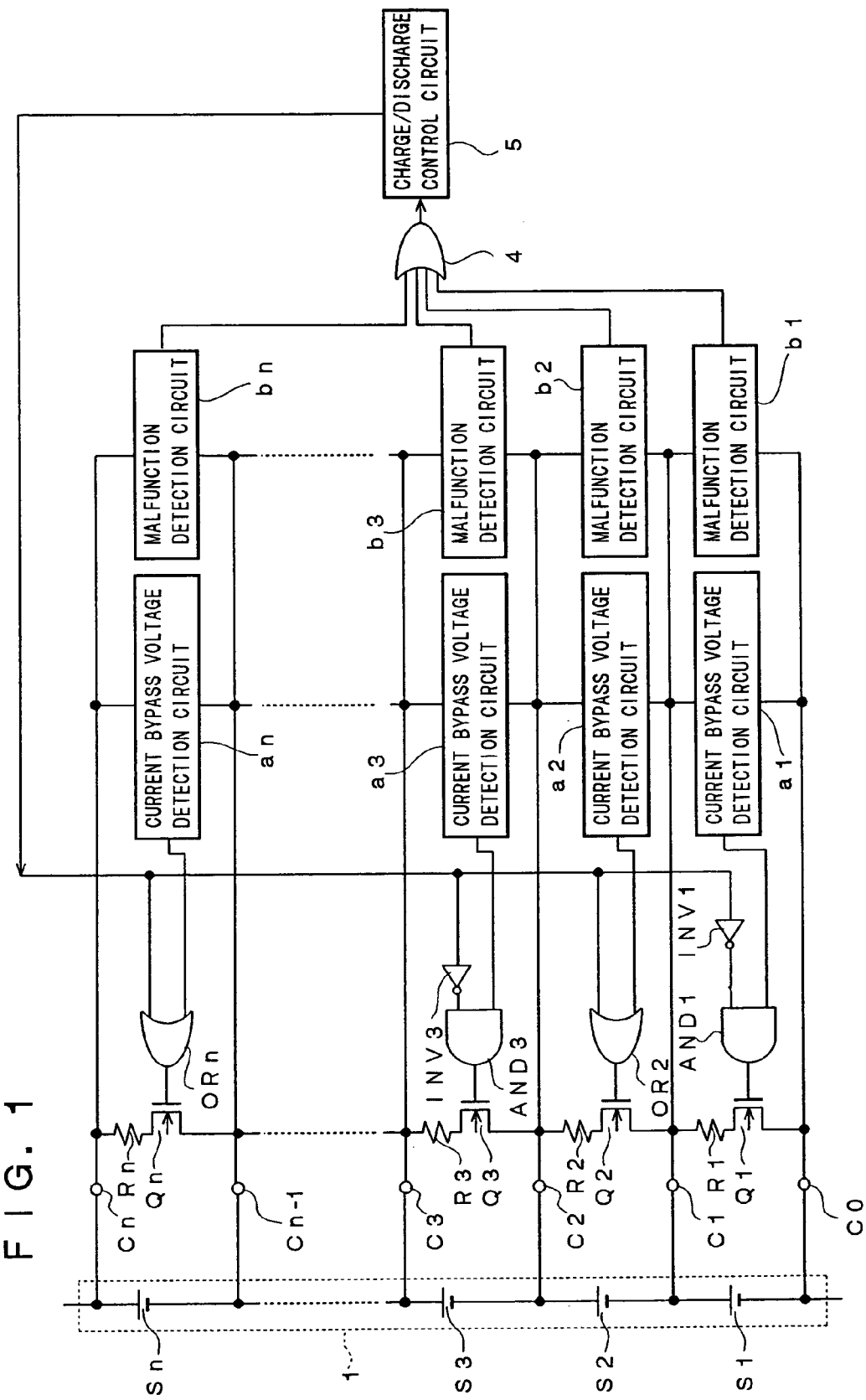
FIG. 1 shows the structure adopted in the battery pack malfunction detection apparatus in a first embodiment.

FIG. 1 shows the structure adopted in the first embodiment of the battery pack malfunction detection apparatus according to the present invention. A battery pack 1 is constituted by connecting in series n (n is an even number) cells s1~sn that can be charged and discharged. Terminals C0~Cn are each connected to a positive terminal or a negative terminal of a given cell s1~sn. In this specification, we term terminals C0~Cn "detection terminals C0~Cn". For instance, the detection terminal C0 is connected to the negative terminal of the cell s1, and the detection terminal C1 is connected to the positive terminal of the cell s1 and the negative terminal of the cell s2.

Current bypass voltage detection circuits a1~an (hereafter referred to as circuits a1~an), which are provided respectably in correspondence to the cells s1~sn, each output an H level signal to a logic circuit upon detecting that the voltage between the two terminals at the corresponding cell s1~sn has exceeded a first predetermined voltage V1. The logic circuit to which the H level signal is output may be one of; AND circuits AND1~ANDn−1 and OR circuits OR2~ORn. For instance, the output from the circuit a1 is input to the AND circuit AND1, whereas the output from the circuit a2 is input to the OR circuit OR2.

Namely, the AND circuits AND1~ANDn−1 and the OR circuit OR2~ORn are alternately connected to the circuits a1~an in the battery pack malfunction detection apparatus in the first embodiment.

It is to be noted that in this specification, an output of the H level signal indicates that a current is flowing and that an output of the L level signal indicates that no current is flowing.

An output signal from a charge/discharge control circuit 5 is input to the input terminal other than the input terminal to which the output from the circuits a1 an is input, of the two input terminals of an AND circuit (AND1~ANDn−1) and an OR circuit (OR2~ORn). However, the level of the signal input from the charge/discharge control circuit 5 to the AND circuits AND1~ANDn−1 is first inverted at inverter circuits INV1~INVn−1 respectively. The output terminals of the AND circuits AND1~ANDn−1 and the OR circuits OR2~ORn are respectively connected to gate terminals of MOS transistors Q1~Qn provided in correspondence to the individual cells s1~sn. Drain terminals of the MOS transistors Q1~Qn are respectively connected to resistors R1~Rn. It is to be noted that the resistance values of the individual resistors R1~Rn are equal to one another.

Each current bypass circuit is constituted of one of the circuits a1~an, the corresponding logic circuit, the corresponding MOS transistors Q1~Qn and the corresponding resistors R1~Rn. The current bypass circuits are employed to prevent inconsistency among the capacities of the individual cells when the cells s1~sn are charged. As described earlier, the circuits a1~an each output an H level signal upon detecting that the voltage between the terminals at the corresponding cell s1~sn has exceeded the first predetermined voltage V1 and thus, the cell has entered a state close to a fully charged state. In response, the corresponding MOS transistor Q1~Qn is turned on as detailed later and, as a result, part of the charge current flowing to the corresponding cell s1~sn is redirected to flow via the resistor R1~Rn connected to the MOS transistor Q1~Qn which has become turned on. Thus, the extent of inconsistency among the capacities at the individual cells can be minimized. It is to be noted that the operations of the logic circuits are to be described in detail later.

Circuits b1~bn for detecting malfunction of cells, which are respectively provided in correspondence to the cells s1~sn, each detect an over-charge when the voltage between the detection terminals of the corresponding cell s1~sn has exceeded a second predetermined voltage V2 (an overcharge judging threshold voltage). In addition, the circuits b1~bn each detect an over-discharge when the voltage between the detection terminals of the corresponding cell s1~sn becomes lower than a third predetermined voltage V3 (an over-discharge judging threshold voltage). Upon detecting an over-charged state or an over-discharged state at a given cell, the corresponding circuits b1~bn outputs a malfunction detection signal (H level) to an OR circuit 4.

If any one of the circuits b1~bn outputs a malfunction detection signal, the OR circuit 4 outputs to the charge/discharge control circuit 5 a signal (H level) indicating that a malfunction has occurred at a cell.

It is to be noted that the three predetermined voltages V1, V2 and V3 achieve a relationship expressed as V2>V1>V3.

Based upon the signal provided by the OR circuit 4, the charge/discharge control circuit 5 controls the charge/discharge of the battery pack 1. In addition, the charge/discharge control circuit 5 outputs a diagnosis execution signal (H level) to execute a diagnosis of the circuits b1~b2 to the logic circuits AND1~ANDn−1 and OR2~ORn. The diagnosis execution signal is output when the charge/discharge control circuit 5 is started up (when the power is turned on) or when the battery pack 1 has not been charged or discharged over a predetermined length of time or longer.

Now the operations of the AND circuits AND1~ANDn−1 among the logic circuits are explained by using the AND circuit AND1 as an example. The AND circuit AND1 executes an AND operation by using the output signal from the circuit a1 and the signal obtained by inverting the diagnosis execution signal provided by the charge/discharge control circuit 5 at the inverter circuit INV1. The result of this arithmetic operation is output to the gate terminal of the MOS transistor Q1.

If the diagnosis execution signal is not output from the charge/discharge control circuit 5, i.e., if an L level signal is currently output from the charge/discharge control circuit 5, an H level signal is input to the AND circuit AND1 via the inverter INV1. As a result, the level of the signal output from the circuit a1 is the same as the level of the signal output from the AND circuit AND1. Thus, the MOS transistor Q1 is turned on when an H level signal is output from the circuit a1, whereas the MOS transistor Q1 is turned off when an L level signal is output from the circuit a1.

If, on the other hand, the diagnosis execution signal is output from the charge/discharge control circuit 5, i.e., if an H level signal is currently output, an L level signal is input to the AND circuit AND1 via the inverter circuit INV1. As a result, the level of the output signal from the AND circuit AND1 is set to L regardless of the level of the output signal from the circuit a1. Thus, the MOS transistor Q1 is forcibly turned off.

Next, the operations of the OR circuits OR2~ORn are explained by using the OR circuit OR2 as an example. The OR circuit OR2 executes an OR operation by using the output signal from the circuit a2 and the diagnosis execution signal provided by the charge/discharge control circuit 5. The result of the arithmetic operation is output to the gate terminal of the MOS transistor Q2.

If the diagnosis execution signal is not output from the charge/discharge control circuit 5, i.e., if an L level signal is currently output, the level of the output signal from the circuit a2 is the same as the level of the output signal from the OR circuit OR2. Thus, the MOS transistor Q2 is turned on when an H level signal is output from the circuit a2, whereas the MOS transistor Q2 is turned off when an L level signal is output from the circuit a2.

If, on the other hand, the diagnosis execution signal is output from the charge/discharge control circuit 5, i.e., if an H level signal is currently output, the level of the output signal from the OR circuit OR2 is set to H regardless of the level of the output signal from the circuit a2. Thus, the MOS transistor Q2 is forcibly turned on.

Although a detailed explanation is omitted, operations similar to that of the AND circuit AND1 are executed at the AND circuits AND3, AND5, . . . and ANDn−1 corresponding to the cells s3, s5 . . . and sn−1 respectively, and operations similar to that of the OR circuit OR2 are executed at the OR circuits OR 4, OR 6 . . . and ORn corresponding to the cells s4, s6, . . . and sn respectively. As described above, when the diagnosis execution signal is output from the charge/discharge control circuit 5, the MOS transistors connected to the AND circuits AND1~ANDn−1 are forcibly turned off and the MOS transistors connected to the OR circuits OR2~ORn are forcibly turned on. As a result, alternate cells among the plurality of cells s1~sn connected in series become shorted, i.e., the detection terminals at alternate cells are shorted from each other, and the detection terminals at the cells adjacent to the cells at which the detection terminals are shorted from each other are opened to each other.

Now, a case in which the connecting line between the positive terminal of the cell s2 (the negative terminal of the cell s3) and the detection terminal C2 is disconnected is examined. It is assumed that the voltages between the terminals at the cells s2 and s3 immediately before the occurrence of the disconnection are higher than the first predetermined voltage V1 and lower than the second predetermined voltage V2 (an over-charge judging threshold voltage). Prior to the disconnection, H level signals are output from the circuits a2 and a3 and, as a result, the MOS transistors Q2 and Q3 are set in an on state, which causes bypass currents to flow via the resistors R2 and R3 respectively. Since neither the cell s2 nor s3 has entered an over-charged state, no malfunction detection signal (H level) is output from the circuit b2 or b3.

Now, let us hypothesize that the connecting line between the positive terminal of the cell s2 (the negative terminal of the cell s3) and the detection terminal C2 becomes disconnected in this state. Under such circumstances, the bypass currents that have been flowing at the individual cells s2 and s3 are made to flow to the negative terminal of the cell s2 from the positive terminal of the cell s3 via the resistor R3, the MOS transistor Q3, the resistor R2 and the MOS transistor Q2. Since the resistance values at the resistors R1~Rn are equal to each other and also, the ON resistances at the MOS transistors Q1~Qn are also set to a single value, the voltage at the detection terminal C2 is set to a level which is ½ of the sum of the voltages between the terminals at the cell s2 and the cell s3, i.e., the voltage at the detection terminal C2 is set to a level which is the average of the voltages at the two cells.

If the diagnosis execution signal (H level) is output from the charge/discharge control circuit 5 in this state, the MOS transistor Q2 connected to the OR circuit OR2 is forcibly turned on and the MOS transistor Q3 connected to the AND circuit AND3 is forcibly turned off. As a result, the flow of the bypass current having been flowing from the positive terminal of the cell s3 to the negative terminal of the cell s2 stops. In this condition, the voltage at the detection terminal C2 is equalized to the voltage at the negative terminal of the cell s2 via the MOS transistor Q2 which is in an ON state and the resistor R2.

Thus, the circuit b2 detects that the voltage between the detection terminals C1 and C2 is lower than the third predetermined voltage V3 (the over-discharge judging threshold voltage value) In addition, a voltage, the level of which is equal to the sum of the voltage of the cell s2 and the voltage of the cell s3, is applied between the detection terminals C2 and C3. Consequently, the circuit b3 detects that the voltage between the detection terminals C2 and C3 is higher than the second predetermined voltage V2 (the overcharge judging threshold voltage value).

Namely, when the diagnosis execution signal (H level) is output from the charge/discharge control circuit 5, the circuit b2 outputs a malfunction signal (H level) indicating an over-discharge and the malfunction detection circuit b3 outputs a malfunction signal (H level) indicating an overcharge. As a result, an H level signal, i.e., a signal indicating that a disconnection has occurred, is input to the charge/discharge control circuit 5 via the OR circuit 4.

Similar operations are executed when disconnections occur between other cells and the corresponding detection terminals. For instance, when the connecting line between the positive terminal of the cell s1 (the negative terminal of the cell s2) and the detection terminal C1 becomes disconnected and the diagnosis execution signal is output from the charge/discharge control circuit 5, the MOS transistor Q1 is forcibly turned off and the MOS transistor Q2 is forcibly turned on.

Since the voltage at the detection terminal C1 is equalized to the voltage at the positive terminal of the cell s2 via the MOS transistor Q2 set in an ON state and the resistor R2, the circuit b2 detects that the voltage between the detection terminals C1 and C2 is lower than the third predetermined voltage v3. In addition, since a voltage, the level of which is equal to the sum of the voltage of the cell s1 and the voltage of the cell s2, is applied between the detection terminals C0 and C1, the circuit b1 detects the voltage between the detection terminals C0 and C1 is higher than the second predetermined voltage V2. As a result, an H level signal is input to the charge/discharge control circuit 5 via the OR circuit 4, enabling the charge/discharge control circuit 5 to detect the disconnection.

It is to be noted that the explanation provided above is given by assuming that the voltages between the terminals of the cells s2 and s3 immediately before the disconnection are higher than the first predetermined voltage V1 and lower than the second predetermined voltage V2. However, a disconnection can be detected when the voltages between the terminals at the cells s2 and s3 immediately before the occurrence of the disconnection are higher than the third predetermined voltage V3 and, at the same time, lower than the first predetermined voltage V1. The operation executed after the output of the diagnosis execution signal from the charge/discharge control circuit 5 is identical and the only difference is that the current bypass function is not engaged prior to the disconnection. However, if any of the circuits b1~bn outputs a signal indicating a malfunction (an over-charge or an over-discharge) of the corresponding cell s1~sn while diagnosing a disconnection, a decision cannot be made as to whether or not a disconnection has occurred, and for this reason, a disconnection diagnosis is not executed in such a case.

FIG. 5 shows the structure of a battery pack malfunction detection apparatus which, unlike the battery pack malfunction detection apparatus in the first embodiment, does not include logic circuits or a signal line through which a diagnosis execution signal is output. Now, in reference to FIG. 5, the advantages achieved by the battery pack malfunction detection apparatus in the first embodiment are explained. It is to be noted that the same reference numerals are assigned to components identical to those shown in FIG. 1 to preclude the necessity for a repeated explanation thereof.

A case in which the connecting line between the positive terminal of the cell s2 (the negative terminal of the cell s3) and the detection terminal C2 is disconnected, as in the situation described earlier, is examined. It is assumed that the voltages between the terminals at the cells s2 and s3 immediately before the occurrence of the disconnection are higher than the first predetermined voltage V1 and lower than the second predetermined voltage V2. Prior to the disconnection, H level signals are output from the circuits a2 and a3 and, as a result, the MOS transistors Q2 and Q3 are set in an ON state, which causes bypass currents to flow via the resistors R2 and R3 respectively. Since neither the cell s2 nor s3 has entered an over-charged state, no malfunction detection signal (H level) is output from the malfunction detection circuit b2 or b3.

Now, let us hypothesize that the connecting line between the positive terminal of the cell s2 (the negative terminal of the cell s3) and the detection terminal C2 becomes disconnected in this state. Under such circumstances, the bypass currents that have been flowing at the individual cells s2 and s3 are made to flow to the negative terminal of the cell s2 from the positive terminal of the cell s3 via the resistor R3, the MOS transistor Q3, the resistor R2 and the MOS transistor Q2. At this time, the voltage at the detection terminal C2 is set to a level which is ½ of the sum of the voltages between the terminals at the cells s2 and s3, i.e., the voltage at the detection terminal C2 is set to a level which is the average of the voltages at cells s2 and s3, for the reason explained earlier. Since the voltages between the terminals at the cells s2 and s3 are both higher than the first predetermined voltage V1 and also lower than the second predetermined voltage V2, their average is also higher than V1 and lower than V2. As a result, no malfunction detection signal is output from either the circuit b2 or the circuit b3, and thus, the disconnection cannot be detected.

In the battery pack malfunction detection apparatus achieved in the first embodiment, the detection terminals are shorted from each other/opened to each other at alternate cells among the plurality of cells s1~sn constituting the battery pack 1 for a disconnection diagnosis and, as a result, any disconnection occurring at the connecting lines between the cells and the corresponding detection terminals can be detected with a high degree of reliability based upon the signals provided by the circuits b1~bn. The individual circuits for shorting the detection terminals from each other are each constituted of a logic circuit that includes one of the AND circuits AND1~ANDn−1 and the corresponding inverter circuit INV1~INVn or one of the OR circuits OR2~ORn and the corresponding MOS transistor Q1~Qn which is a semiconductor switch. Thus, a disconnection between a cell and a corresponding detection terminal can be detected without having to add large-scale circuits for disconnection detection.

In addition, the shorting circuits constituted of the logic circuits and the semiconductor switches described above also function as current bypass circuits each capable of partially bypassing the current flowing to the corresponding cell if the voltage between the detection terminals becomes equal to or higher than the first predetermined voltage V1. Thus, the malfunction detection apparatus, which includes both malfunction detection circuits for detecting cell malfunctions and current bypass circuits, is capable of detecting a disconnection through a simple structure. Furthermore, only one diagnosis execution signal needs to be output from the charge/discharge control circuit 5 to detect a disconnection at any of the connecting lines between the individual cells and corresponding detection terminals when executing the disconnection diagnosis.

Second Embodiment

Figure 2:
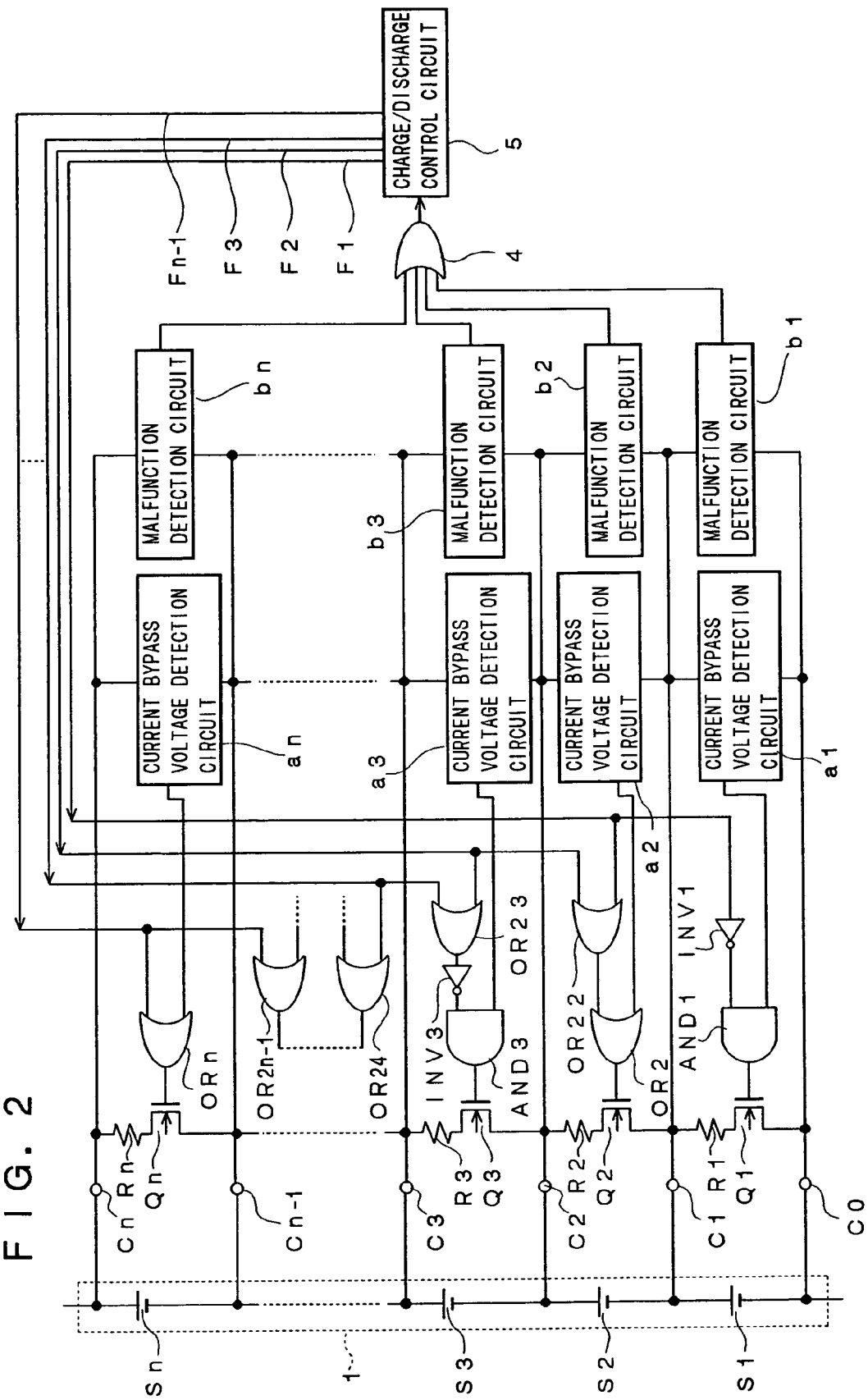
FIG. 2 shows the structure adopted in the battery pack malfunction detection apparatus in a second embodiment.

FIG. 2 shows the structure adopted in the battery pack malfunction detection apparatus in the second embodiment. The same reference numerals are assigned to components identical to those in the battery pack malfunction detection apparatus in the first embodiment shown in FIG. 1 to preclude the necessity for a repeated explanation thereof. The diagnosis execution signal output from the charge/discharge control circuit 5 is provided through multiple signal lines in the battery pack malfunction detection apparatus in the second embodiment, and the logic circuits to which the diagnosis execution signal is input include additional logic circuits in the second embodiment.

The new logic circuits provided in addition to those in the battery pack malfunction detection apparatus in the first embodiment are OR circuits OR22~OR2n−1. Namely, the OR circuits OR22~OR2n−1 are added in correspondence to the OR circuits and the AND circuits at the cells except for the cells s1 and sn, i.e., in correspondence to the OR circuits and the AND circuits at the cells s2~sn−1.

A diagnosis execution signal F1 output from the charge/discharge control circuit 5 is input to the inverter circuit INV1 corresponding to the cell s1 and is also input to the OR circuit OR2 corresponding to the cell s2 via the OR circuit OR22. A diagnosis execution signal F2 is input to the OR circuit OR2 corresponding to the cell s2 via the OR circuit OR22 and is also input to the inverter circuit INV3 corresponding to the cell s3 via the OR circuit OR23. Diagnosis execution signals F3~Fn−2 are input in a similar manner. A diagnosis execution signal Fn−1 is input to the inverter circuit INVn−1 corresponding to the cell sn−1 via the OR circuit OR2n−1 and is also input to the OR circuit ORn corresponding to the cell sn.

The diagnosis execution signal F1 is output to detect a disconnection at the connecting line between the positive terminal of the cell s1 (the negative terminal of the cell s2) and the detection terminal C1. In addition, the diagnosis execution signal F2 is output to detect a disconnection at the connecting line between the positive terminal of the cell s2 (the negative terminal of the cell s3) and the detection terminal C2. The diagnosis execution signals F3, F4 . . . are all output for similar purposes, and the diagnosis execution signal Fn−1 is output to detect a disconnection at the connecting line between the positive terminal of the cell sn−1 (the negative terminal of the cell sn) and the detection terminal Cn−1.

Now, let us examine a case in which a disconnection occurs at the connecting line between the positive terminal of the cell s2 (the negative terminal of the cell s3) and the detection terminal C2. As in the explanation of the first embodiment, it is assumed that the voltages between the terminals at the cells s2 and s3 immediately before the disconnection are both higher than the first predetermined voltage V1 and lower than the second predetermined voltage V2. The diagnosis execution signal F2 (H level) is output from the charge/discharge control circuit 5 to detect a disconnection at the connecting line.

As the diagnosis execution signal F2 is output from the charge/discharge control circuit 5, the output of the OR circuit OR22 is set to H level, which sets the output of the OR circuit OR2 to H level to forcibly turn on the MOS transistor Q2. In addition, the output of the OR circuit OR23 is set to H level, and thus, an L level signal is input to the AND circuit AND3 via the inverter circuit INV3. As a result, the output of the AND circuit AND3 is set to L level, thereby forcibly turning off the MOS transistor Q3.

Consequently, the flow of the bypass current having been flowing from the positive terminal of the cell s3 to the negative terminal of the cell s2 via the resistor R3, the MOS transistor Q3, the resistor R2 and the MOS transistor Q2 stops, as in the first embodiment. Since the voltage at the detection terminal C2 becomes equal to the voltage at the negative terminal of the cell s2, the circuit b2 detects that the voltage between the detection terminals C1 and C2 is lower than the third predetermined voltage V3 and outputs a malfunction detection signal (H level) indicating an overdischarge to the charge/discharge control circuit 5 via the OR circuit 4. In addition, a voltage, the level of which is equal to the sum of the voltage of the cell s2 and the voltage of the cell s3 is applied between the detection terminals C2 and C3. Thus, the circuit b3 detects that the voltage between the detection terminals C2 and C3 is higher than the second predetermined voltage V2 and accordingly outputs a malfunction detection signal indicating an overcharge to the charge/discharge control circuit 5 via the OR circuit 4.

In this situation, an H level signal is input to the charge/discharge control circuit 5 via the OR circuit 4. In other words, the charge/discharge control circuit 5, having output the diagnosis execution signal F2 and then received the H level signal input thereto, is able to detect that a disconnection has occurred at the connecting line between the positive terminal of the cell s2 (the negative terminal of the cell s3) and the detection terminal C2.

A disconnection between another cell and a detection terminal is detected through a similar operation. For instance, the diagnosis execution signal F1 is output from the charge/discharge control circuit 5 when detecting a disconnection at the connecting line between the positive terminal of the cell s1 (the negative terminal of the cell s2) and the detection terminal C1. In response, the MOS transistor Q1 is forcibly turned off and the MOS transistor Q2 is forcibly turned on. If the connecting line described above is disconnected, the voltage at the detection terminal C1 becomes equal to the voltage at the positive terminal of the cell s2. As a result, the circuit b2 detects that the voltage between the detection terminals C1 and C2 is lower than the third predetermined voltage V3. In addition, the circuit b1 detects that the voltage between the detection terminals C0 and C1 is higher than the second predetermined voltage V2.

In this case, too, the charge/discharge control circuit 5, based upon an H level signal input thereto via the OR circuit 4 after outputting the diagnosis execution signal F1, detects that the connecting line between the positive terminal of the cell s1 (the negative terminal of the cell s2) and the detection terminal C1 is disconnected.

The battery pack malfunction detection apparatus in the second embodiment implements individual control on the circuits that short and open the detection terminals from each other at alternate cells by utilizing the diagnosis execution signals F1~Fn-1. As a result, a disconnection between a given cell and a corresponding detection terminal can be detected and, at the same time, the exact location of the disconnection can be identified with ease.

Third Embodiment

Figure 3:
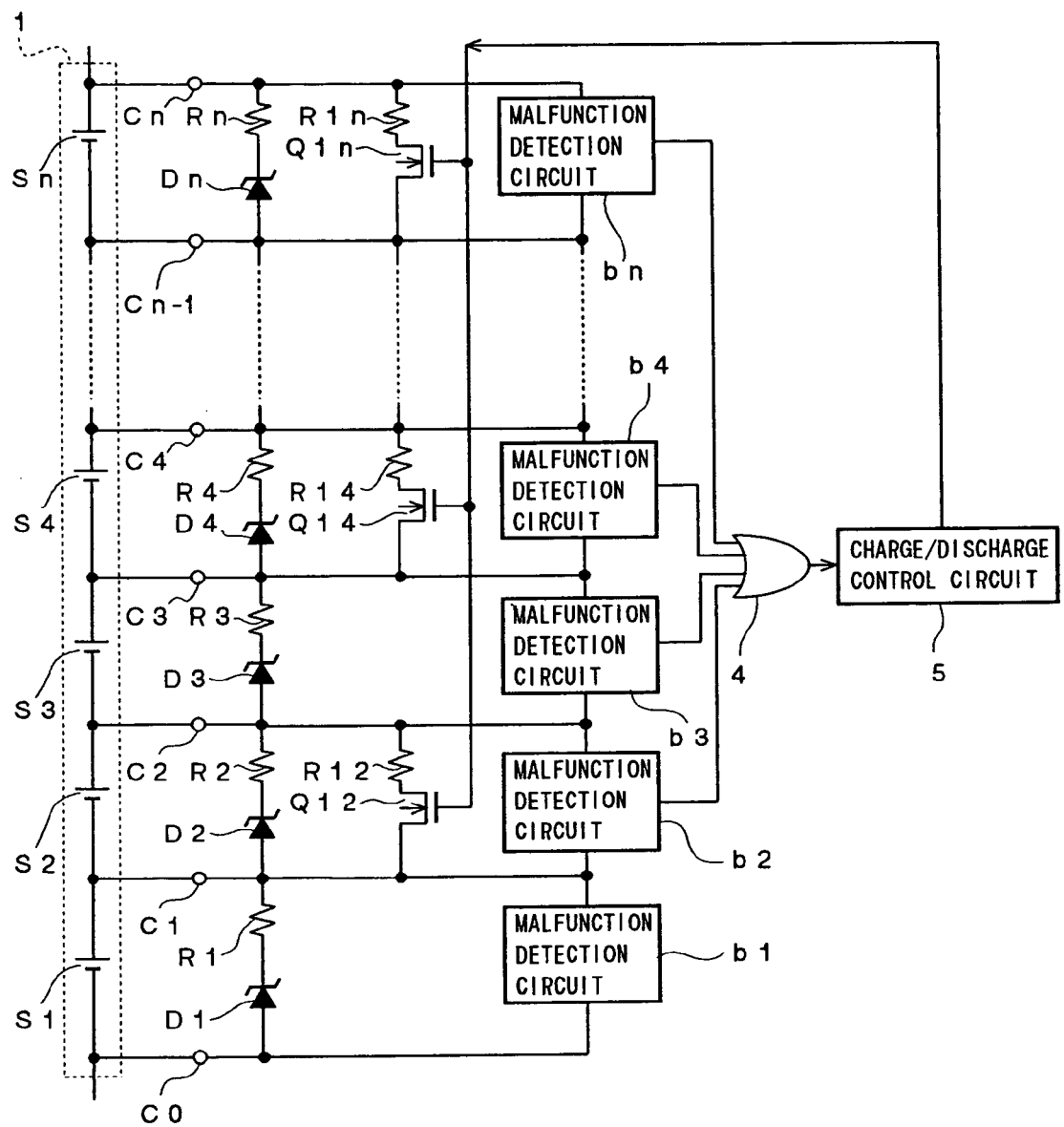
FIG. 3 shows the structure adopted in the battery pack malfunction detection apparatus in a third embodiment.

FIG. 3 shows the structure adopted in the battery pack malfunction detection apparatus in the third embodiment. The same reference numerals are assigned to components identical to those in the battery pack malfunction detection apparatus in the first embodiment shown in FIG. 1 to preclude the necessity for a repeated explanation thereof. In the battery pack malfunction detection apparatus in the third embodiment, each current bypass circuit is constituted of one of resistors R1~Rn and the corresponding Zener diodes D1~Dn.

A Zener voltage VZ at the Zener diodes D1~Dn is set to a fourth predetermined voltage V4 which is lower than the full charge voltage at the cells s1~sn. The second, third and fourth predetermined voltages V2, V3 and V4 achieve a relationship expressed as V2>V4>V3. If the voltage between the terminals at any one of the cells s1~sn exceeds the fourth predetermined voltage V4, a current starts to flow to the corresponding Zener diode D1~Dn. In other words, a bypass current flows to the Zener diode D1~Dn via the resistor R1~Rn connected in series to the Zener diodes D1~Dn. The current bypass function is effected in this manner.

Cells provided at even-numbered positions counting from lowest-order cell, e.g., the cells s2, s4, s6 . . . sn, are each connected in parallel with a serial circuit constituted of one of MOS transistors Q12~Q1n and a corresponding resistor R12~R1n. For instance, the serial circuit constituted of the resistor R12 and the MOS transistor Q12 is connected in parallel to the cell s2. A diagnosis execution signal from the charge/discharge control circuit 5 is input to the gate terminal of the MOS transistor Q12. The source terminal of the MOS transistor Q12 is connected to the negative terminal of the corresponding cell s2, whereas the drain terminal of the MOS transistor Q12 is connected to the positive terminal of the cell s2 via the resistor R12.

On/off control of the MOS transistors Q12~Q1n is implemented based upon the signal provided by the charge/discharge control circuit 5. As the diagnosis execution signal (H level) is output from the charge/discharge control circuit 5, the MOS transistors Q12~Q1n become turned on. As a result, the detection terminals at alternate cells among the plurality of cells s1~sn constituting the battery pack 1 become shorted from each other. If, on the other hand, the diagnosis execution signal is not output (L level), the MOS transistors Q12~Q1n are turned off.

A value that is sufficiently smaller than the resistance value at the resistors R1~Rn is set for the resistance value of the resistors R12~R1n that are connected in series to the MOS transistors Q12~Q1n respectively. Thus, if the MOS transistors Q12~Q1n are turned on while the current bypass function is engaged, most of the bypass currents flow toward the resistors R12~R1n connected in series to the MOS transistors Q12~Q1n having entered an ON state.

Now, let us examine a case in which a disconnection occurs at the connecting line between the positive terminal of the cell s2 (the negative terminal of the cell s3) and the detection terminal C2. It is assumed that the voltages between the terminals at the cells s2 and s3 immediately before the disconnection are higher than the fourth predetermined voltage V4 and, at the same time, lower than the second predetermined voltage V2. With currents flowing via the Zener diodes D2 and D3, the current bypass function is in effect prior to the disconnection. However, since neither the cell s2 nor the cell s3 has reached an overcharged state, no malfunction detection signal (H level) is output from the circuit b2 or b3.

If the connecting line between the positive terminal of the cell s2 (the negative terminal of the cell s3) and the detection terminal C2 becomes disconnected in this state, the bypass currents that have been flowing at the individual cells s2 and s3 are made to flow to the negative terminal of the cell s2 from the positive terminal of the cell s3 via the resistor R3, the Zener diode D3, the resistor R2 and the Zener diode D2. Since the resistance values at the resistors R1~Rn are equal to each other and also, the Zener voltages at the Zener diodes D1~Dn are also set to a single value, the voltage at the detection terminal C2 is set to a level which is ½ of the sum of the voltages between the terminals at the cell s2 and the cell s3, i.e., the voltage at the detection terminal C2 is set to a level which is the average of the voltages at the two cells.

If the diagnosis execution signal (H level) is output from the charge/discharge control circuit 5 at this point, the MOS transistor Q12 is turned on, and the bypass current having been flowing via the resistor R2 and the Zener diode D2 branches to flow to the serial circuit constituted of the resistor R12 and the MOS transistor Q12 as well. Since the resistance value of the resistor R12 is set to a value sufficiently smaller than the resistance value of the resistor R2 (R3) as described above, most of the bypass current flows to the serial circuit constituted of the resistor R12 and the MOS transistor Q12. Thus, the voltage at the detection terminal C2 becomes very close to the voltage at the negative terminal of the cell s2. As a result, the circuit b2 detects that the voltage between the detection terminals C1 and C2 is lower than the third predetermined voltage V3 and the circuit b3 detects that the voltage between the detection terminals C2 and C3 is higher than the second predetermined voltage V2.

Consequently, the circuit b2 outputs a malfunction detection signal (H level) indicating an over-discharge and the circuit b3 outputs a malfunction detection signal (H level)

indicating an overcharge. Thus, an H level signal is input to the charge/discharge control circuit 5 via the OR circuit 4 from the circuits b2 and b3.

A similar operation is executed when a disconnection occurs between another cell and a detection terminal. An explanation is given below on an example in which a disconnection occurs at the connecting line between the positive terminal of the cell s3 (the negative terminal of the cell s4) and the detection terminal C3. It is assumed that the voltages between the terminals at the cells s3 and s4 immediately before the disconnection are higher than the fourth predetermined voltage V4 and lower than the second predetermined voltage V2. In this situation, currents are flowing to the Zener diodes D3 and D4 and the current bypass function is in effect. However, since neither the cell s3 nor the cell s4 has entered an overcharged state, no malfunction detection signal (H level) is output from the circuit b3 or b4.

Now, let us hypothesize that the connecting line between the positive terminal of the cell s3 (the negative terminal of the cell s4) and the detection terminal C3 becomes disconnected in this state. Under such circumstances, the bypass currents that have been flowing at the individual cells s3 and s4 are made to flow to the negative terminal of the cell s3 from the positive terminal of the cell s4 via the resistor R4, the Zener diode D4, the resistor R3 and the Zener diode D3. Thus, for the reason detailed above, the voltage at the detection terminal C3 is set to a level which is ½ of the sum of the voltages between the terminals at the cell s3 and the cell s4, i.e., the voltage at the detection terminal C3 is set to a level which is the average of the voltages at the two cells.

If the diagnosis execution signal (H level) is output from the charge/discharge control circuit 5 at this point, the MOS transistor Q14 is turned on, and the bypass current having been flowing via the resistor R4 and the Zener diode D4 branches to flow to the serial circuit constituted of the resistor R14 and the MOS transistor Q14 as well. Due to the relationship between the values of the resistance at the resistor R4 (R3) and the resistance of the resistor R14, the voltage at the detection terminal C3 becomes very close to the voltage at the positive terminal of the cell s4. As a result, the circuit b3 detects that the voltage between the detection terminals C2 and C3 is higher than the second predetermined voltage V2 and the circuit b4 detects that the voltage between the detection terminals C3 and C4 is lower than the third predetermined voltage V3. Consequently, an H level signal is input to the charge/discharge control circuit 5 via the OR circuit 4 from the circuits b3 and b4.

The charge/discharge control circuit 5 is thus enabled to detect the disconnection based upon the H level signal input thereto after outputting the diagnosis execution signal.

Figure 6:
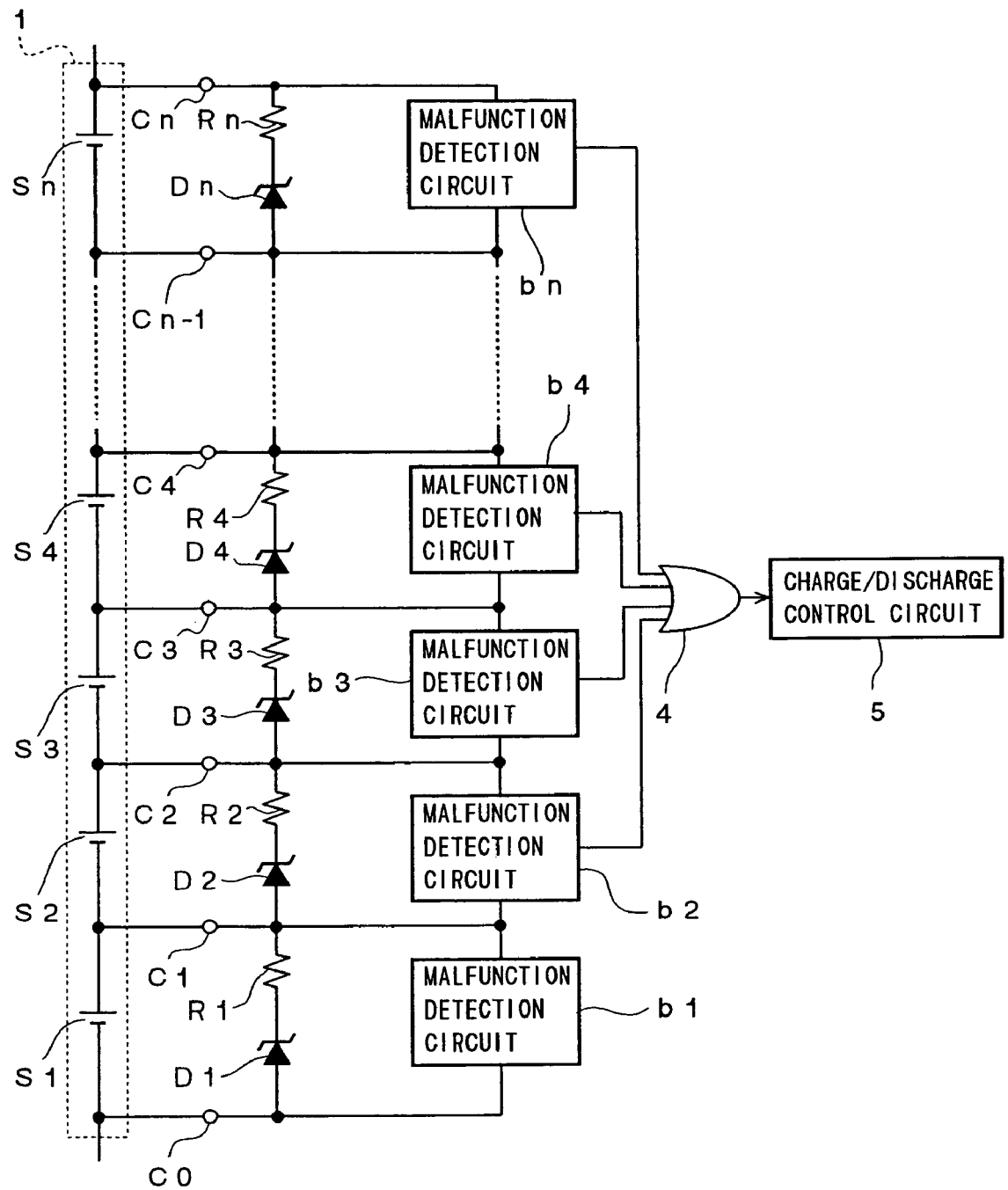
FIG. 6 shows the structure of a battery pack malfunction detection apparatus to be compared with the battery pack malfunction detection apparatus achieved in the third embodiment in the explanation of advantages thereof.

FIG. 6 shows the structure of a battery pack malfunction detection apparatus which, unlike the battery pack malfunction detection apparatus in the third embodiment, does not include MOS transistors and a signal line through which a diagnosis execution signal is output. In reference to FIG. 6, the advantages achieved by the battery pack malfunction detection apparatus in the third embodiment are explained. It is to be noted that the same reference numerals are assigned to components identical to those shown in FIG. 3 to preclude the necessity for a repeated explanation thereof.

A case in which the connecting line between the positive terminal of the cell s2 (the negative terminal of the cell s3) and the detection terminal C2 is disconnected, as in the situation described earlier, is examined. It is assumed that the voltages between the terminals at the cells s2 and s3 immediately before the occurrence of the disconnection are higher than the fourth predetermined voltage V4 and lower than the second predetermined voltage V2. While bypass currents flow to the Zener diodes D3 and D4 respectively, neither the cell s2 nor s3 has reached an overcharged state at this point and thus, no malfunction detection signal (H level) is output from the circuit b2 or b3.

Now, let us hypothesize that the connecting line between the positive terminal of the cell s2 (the negative terminal of the cell s3) and the detection terminal C2 becomes disconnected in this state. Under such circumstances, the bypass currents that have been flowing at the individual cells s2 and s3 are made to flow to the negative terminal of the cell s2 from the positive terminal of the cell s3 via the resistor R3, the Zener diode D3, the resistor R2 and the Zener diode D2. At this time, the voltage at the detection terminal C2 is set to a level which is ½ of the sum of the voltages between the terminals at the cells s2 and s3, i.e., the voltage at the detection terminal C2 is set to a level which is the average of the voltages at cells s2 and s3, for the reason explained earlier. Since the voltages between the terminals at the cells s2 and s3 are both higher than the fourth predetermined voltage V4 and also lower than the second predetermined voltage V2, their average is also higher than V4 and lower than V2. As a result, no malfunction detection signal is output from either the circuit b2 or the circuit b3, and thus, the disconnection cannot be detected.

The battery pack malfunction detection apparatus achieved in the third embodiment, which employs current bypass circuits constituted of semiconductor switches, i.e., the Zener diodes D1~Dn, too, is capable of detecting a disconnection at any of the connecting lines between the cells s1~sn and the detection terminals C1~Cn with a high degree of reliability. Namely, by utilizing circuits each having a function of partially bypassing the current flowing to the corresponding cell as the voltage between the detection terminals becomes equal to or higher than a predetermined voltage level and, in response, the semiconductor switch connected between the detection terminals becomes turned on, a disconnection at the connecting line between a given cell and a corresponding detection terminal can be detected with a high degree of reliability based upon signals output from the malfunction detection circuits when the adjacent semiconductor switches are forcibly turned on/off alternately. Thus, disconnections can be detected without having to provide any additional large-scale disconnection detection circuits.

Furthermore, only one diagnosis execution signal needs to be output from the charge/discharge control circuit 5 to detect a disconnection of any of the connecting lines between the individual cells and corresponding detection terminals when executing the disconnection diagnosis.

Fourth Embodiment

Figure 4:
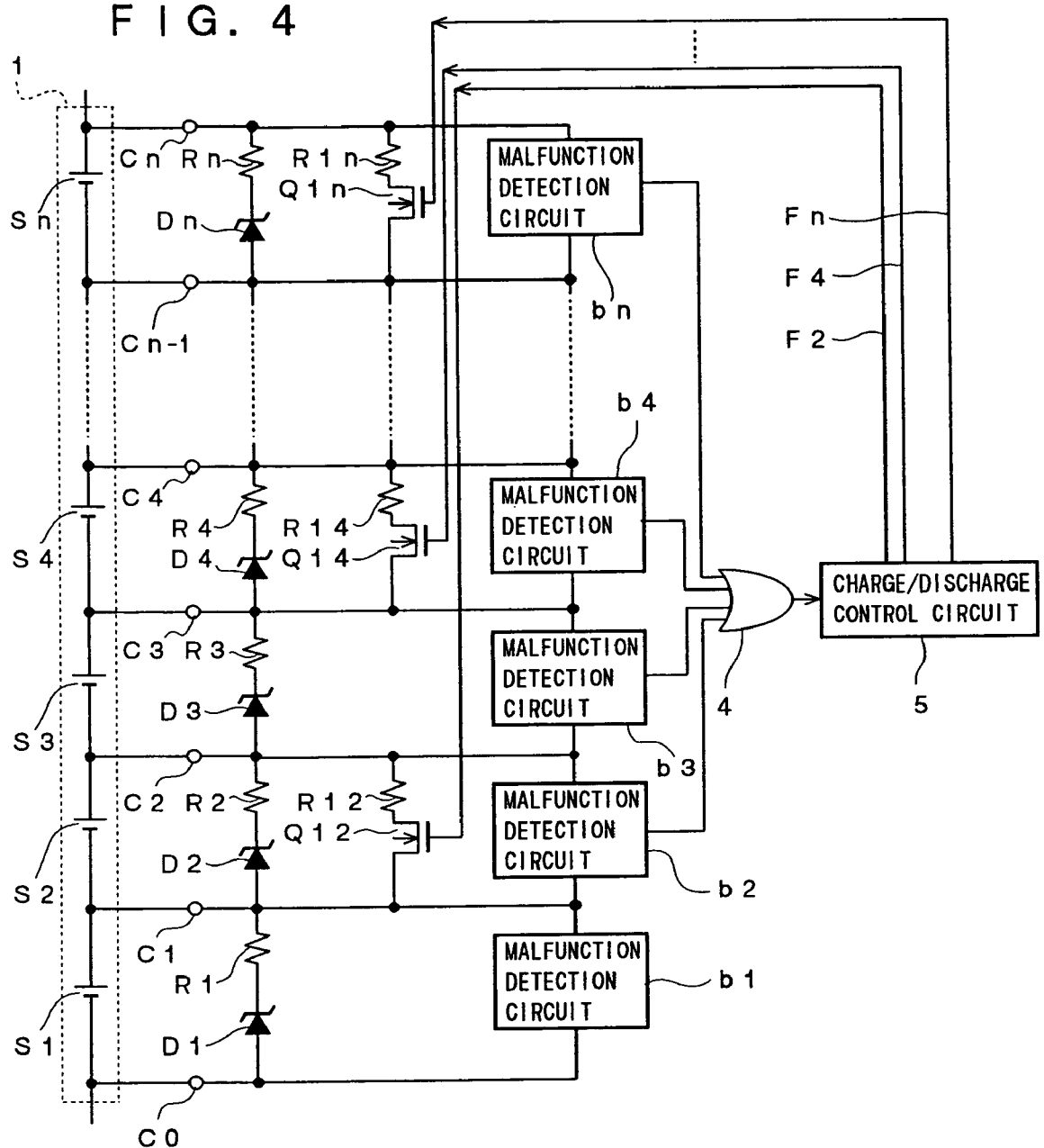
FIG. 4 shows the structure adopted in the battery pack malfunction detection apparatus in a fourth embodiment.

FIG. 4 shows the structure adopted in the battery pack malfunction detection apparatus in the fourth embodiment. The same reference numerals are assigned to components identical to those in the battery pack malfunction detection apparatus in the third embodiment shown in FIG. 3 to preclude the necessity for a repeated explanation thereof. The diagnosis execution signal is output from the charge/discharge control circuit 5 is provided through multiple signal lines in the battery pack malfunction detection apparatus in the fourth embodiment.

A diagnosis execution signal F2 is input to the gate terminal of the MOS transistor Q12 so as to detect any disconnection at the connecting line between the positive terminal of the cell s1 (the negative terminal of the cell s2) and the detection terminal C1 and the connecting line between the positive terminal of the cell s2 (the negative terminal of the cell s3) and the detection terminal C2. Diagnosis execution signal F4 is input to the gate terminal of the MOS transistor Q14 so as to detect any disconnection occurring at the connecting line between the positive terminal of the cell s3 (the negative terminal of the cell s4) and the detection terminal C3 and the connecting line between the positive terminal of the cell s4 (the negative terminal of the cell s5) and the detection terminal C4. Diagnosis execution signals F6, F8, . . . are input to the corresponding gate terminals in a similar manner, and, for instance, a diagnosis execution signal Fn is input to the gate terminal of the MOS transistor Q1n so as to detect any disconnection at the connecting line between the positive terminal of the cell sn−2 (the negative terminal of the cell sn−1 and the detection terminal Cn−1 and the connecting line between the positive terminal of the cell sn−1 (the negative terminal of the cell sn) and the detection terminal Cn.

Lets us now examine a case in which a disconnection occurs at the connecting line between the positive terminal of the cell s2 (the negative terminal of the cell s3) and the detection terminal C2. Since the operation executed immediately before the disconnection is identical to that in the third embodiment, its explanation is omitted. If the diagnosis execution signal F2 (H level) is output from the charge/discharge control circuit 5, the MOS transistor Q12 is turned on. As a result, the bypass current having been flowing via the resistor R2 and the Zener diode D2 branches to flow to the serial circuit constituted of the resistor R12 and the MOS transistor Q12 as well. For the reason detailed earlier, the voltage at the detection terminal C2 becomes very close to the voltage at the negative terminal of the cell s2. In response, the circuit b2 detects that the voltage between the detection terminals C1 and C2 is lower than the third predetermined voltage V3 and the circuit b3 detects that the voltage between the detection terminals C2 and C3 is higher than the second predetermined voltage V2.

Consequently, the circuit b2 outputs a malfunction detection signal (H level) indicating an over-discharge and the circuit b3 outputs a malfunction detection signal (H level) indicating an overcharge. Thus, an H level signal is input to the charge/discharge control circuit 5 via the OR circuit 4. Based upon the H level signal input thereto after outputting the diagnosis execution signal F2, the charge/discharge control circuit 5 is able to detect that a disconnection has occurred either at the connecting line between the positive terminal of the cell s2 (the negative terminal of the cell s3) and the detection terminal C2 or the connecting line between the positive terminal of the cell s1 (the negative terminal of the cell s2) and the detection terminal C1.

A similar operation is performed to detect a disconnection between another cell and a corresponding detection terminal. For instance, the charge/discharge control circuit 5 outputs the diagnosis execution signal F4 to detect a disconnection at the connecting line between the positive terminal of the cell s3 (the negative terminal of the cell s4) and the detection terminal C3. It is to be noted that since the operation executed when a disconnection occurs at the connecting line between the positive terminal of the cell s3 (the negative terminal of the cell s4) and the detection terminal C3 is identical to that executed in the third embodiment, its explanation is omitted.

The battery pack malfunction detection apparatus achieved in the fourth embodiment, which employs current bypass circuits constituted of the Zener diodes D1~Dn, is capable of detecting a disconnection at any of the connecting lines between the cells s1~sn and the detection terminals C1~Cn and also capable of identifying the location of the disconnection. Namely, since the charge/discharge control circuit 5 implements individual control on the MOS transistors Q12~Q1n by utilizing the diagnosis execution signals F2, F4, . . . Fn, the location of a disconnection between a cell and a corresponding detection terminal can be identified with ease.

The above described embodiment are examples, and various modifications can be made without departing from the spirit and scope of the invention. For instance, while MOS transistors are used as semiconductor switches constituting the current bypass circuits in the battery pack malfunction detection apparatus in the first and second embodiment, the current bypass circuits may instead be constituted of bipolar transistors.

The disclosure of the following priority application is herein incorporated by reference:

Japanese Patent Application No. 2002-243178 filed Aug. 23, 2002.

What is claimed is:

1. A battery pack malfunction detection apparatus for detecting a malfunction in a battery pack constituted by connecting in series a plurality of cells, comprising:
   detection terminals each connected to either of two terminals of one of the plurality of cells;
   malfunction detection circuits each provided in correspondence to one of the plurality of cells to detect a malfunction of a corresponding cell based upon a voltage between the detection terminals;
   a plurality of shorting circuits that short every other pair of detection terminals;
   a control circuit that engages the shorting circuits in operation; and
   a disconnection detection circuit that detects a disconnection at a connecting line between a given cell and a corresponding detection terminal based upon signals output from the malfunction detection circuits when the control circuit engages the shorting circuits in operation.

2. A battery pack malfunction detection apparatus according to claim 1, wherein:
   the shorting circuits each include a semiconductor switch so as to short the detection terminals by turning on/off the semiconductor switch.

3. A battery pack malfunction detection apparatus according to claim 1, wherein:
   the control circuit simultaneously controls all the shorting circuits.

4. A battery pack malfunction detection apparatus according to claim 1, wherein:
   the control circuit individually controls the shorting circuits so as to identify a location of a disconnection.

5. A battery pack malfunction detection apparatus according to claim 1, wherein:
   the shorting circuits also function as current bypass circuits each of which partially bypasses a current flowing to a corresponding cell when the voltage between the detection terminals becomes equal to or higher than a first predetermined voltage.

6. A battery pack malfunction detection apparatus according to claim 1, wherein:
   the malfunction detection circuits each detect an overcharged state in the corresponding cell by comparing the voltage between the detection terminals and a second predetermined voltage and detects an over-discharged state in the corresponding cell by comparing the voltage between the detection terminals and a third predetermined voltage; and the disconnection detection circuit detects a disconnection if a malfunction detection circuit outputs a signal indicating an overcharged state or an over-discharged state in the corresponding cell when the control circuit engages the shorting circuits in operation.

7. A battery pack malfunction detection apparatus according to claim 1, further comprising:

opening circuits each provided for one of cells at which the shorting circuits are not provided, so as to open the detection terminals, wherein;

the control circuit engages the open circuits in operation concurrently when the shorting circuits are engaged in operation; and the disconnection detection circuit detects a disconnection of a connecting line between a cell and a corresponding detection terminal based upon signals output from the malfunction detection circuits when the control circuit engages the shorting circuits and the open circuits in operation.

8. A battery pack malfunction detection apparatus according to claim 1, further comprising:

current bypass circuits each provided in correspondence to one of the plurality of cells to partially bypass a current flowing to the corresponding cell as the voltage between the detection terminals becomes equal to or higher than a first predetermined voltage and a semiconductor switch connected between the detection terminals enters an ON state.

9. A method of detecting a malfunction of a battery pack constituted by connecting in series a plurality of cells, wherein:

shorting detection terminals alternately among detection terminals each provided in correspondence to either of two terminals of one of the plurality of cells; and detecting a disconnection of a connecting line between a cell and a corresponding detection terminal based upon signals output from malfunction detection circuits each provided to detect a malfunction of the corresponding cell based upon a voltage between the detection terminals when the detection terminals at alternate cells are shorted.

* * * * *